US009151796B2

(12) United States Patent
Wang et al.

(10) Patent No.: US 9,151,796 B2
(45) Date of Patent: Oct. 6, 2015

(54) AUTOMATIC TEST EQUIPMENT AND A TESTING METHOD THEREOF

(71) Applicant: Wistron Corporation, New Taipei (TW)

(72) Inventors: Chun-Kai Wang, New Taipei (TW); Hai-Jun Peng, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 172 days.

(21) Appl. No.: 13/897,954

(22) Filed: May 20, 2013

(65) Prior Publication Data
US 2014/0139235 A1 May 22, 2014

(30) Foreign Application Priority Data

Nov. 16, 2012 (CN) .......................... 2012 1 0466562

(51) Int. Cl.
G01R 31/28 (2006.01)
G11C 29/56 (2006.01)

(52) U.S. Cl.
CPC ........ *G01R 31/2834* (2013.01); *G01R 31/2806* (2013.01); *G01R 31/2886* (2013.01); *G01R 31/2889* (2013.01); *G11C 29/56* (2013.01)

(58) Field of Classification Search
CPC .. G11C 29/56012; G11C 29/56; G01R 15/14; G01R 15/125; G01R 13/04; G01R 19/145; G01R 19/155; G01R 19/2506; G01R 31/006; G01R 31/007; G01R 31/026; G01R 31/024; G01R 31/025; G01R 31/2834; G01R 31/31922; G01R 31/2886; G01R 31/2889; G01R 1/06788; G01R 1/30

USPC .......................................... 324/503, 555–556
See application file for complete search history.

(56) References Cited

U.S. PATENT DOCUMENTS 7,443,183 B2 * 10/2008 Yin et al. ................. 324/763.01
7,583,096 B2 * 9/2009 Hosaka et al. ........... 324/755.11
2004/0178815 A1 * 9/2004 Ou et al. ....................... 324/755

FOREIGN PATENT DOCUMENTS

| CN | 101071784 B | 8/2010 |
|---|---|---|
| TW | 498976 | 8/2002 |
| TW | 553390 | 9/2003 |
| TW | 590219 | 6/2004 |
| TW | 590219 U | 6/2004 |
| TW | M326152 | 1/2008 |
| TW | M343793 U | 11/2008 |
| TW | M428728 | 5/2012 |
| TW | M429875 | 5/2012 |

* cited by examiner

*Primary Examiner* — Melissa Koval
*Assistant Examiner* — Felicia Farrow
(74) *Attorney, Agent, or Firm* — Muncy, Geissler, Olds & Lowe, P.C.

(57) ABSTRACT

An automatic test equipment includes a test apparatus, a first control device, a first assisting device, and a second control device. The test apparatus is applied for testing a first object, wherein the test apparatus has a first cover. The first control device has an activating device. The first assisting device is electrically connected to the first control device. The second control device is electrically connected to the first control device and the test apparatus. When the activating device is activated, the first control device controls the first assisting device to lower the first cover and then the first control device transmits a first control signal to the second control device for allowing the test apparatus to test the first object.

11 Claims, 6 Drawing Sheets

AUTOMATIC TEST EQUIPMENT AND A TESTING METHOD THEREOF

BACKGROUND OF THE INVENTION

1. Field of the Invention

The present invention relates to an automatic test equipment; more particularly, the present invention relates to an automatic test equipment capable of automatically raising and lowering an upper cover of a test apparatus.

2. Description of the Related Art

Conventionally, operations of an automatic test equipment for a printed circuit board generally include the following procedures: an operator manually raises an upper cover of a test apparatus, places a printed circuit board on a needle bed, manually lowers the upper cover of the test apparatus, and then activates a test process; after the test process is completed, the operator once again manually raises the upper cover of the test apparatus and removes the tested object.

The weight of the upper cover of the test apparatus is about 15 kilograms. According to the operations of current production lines, an operator on average needs to repeatedly and manually perform the actions of raising and lowering the upper cover of the test apparatus hundreds or even thousands of times within one working day. In the long run, repeatedly raising and lowering an upper cover weighing 15 kilograms can cause damage to the tendons of the operator's arm, thereby increasing the probability of occupational injury to the operator. Furthermore, performing repetitive actions for a long period of time will also increase the operator's work fatigue, such that working efficiency may be reduced and the chance of errors occurring during the testing task may be increased as well.

Therefore, there is a need to provide a novel automatic test equipment, the upper cover of the test apparatus of which automatically rises and falls so as to reduce the probability of occupational injury and operational error and thereby to mitigate and/or obviate the aforementioned problems.

SUMMARY OF THE INVENTION

It is an object of the present invention to provide an automatic test equipment capable of automatically raising and lowering an upper cover of a test apparatus.

To achieve the abovementioned object, the automatic test equipment of the present invention comprises a test apparatus, a first control device, a first assisting device and a second control device. The test apparatus is applied for testing a first object. The test apparatus comprises a base and a first cover. The base comprises a first testing zone used for placing and testing the first object. The first cover comprises a first pivoting end and a first connection end opposite to the first pivoting end, wherein the first cover and the base are pivotally connected to the first pivoting end. The first assisting device is electrically connected to the first control device. The first assisting device comprises a first driving device and a first transmission member, wherein the first transmission member is respectively connected to the first driving device and the first connection end. When an activating device is triggered, the first control device activates the first driving device, and the first driving device drives the first transmission member so as to lower the first cover according to the drive of the first transmission member until the first cover covers the first testing zone, and then the first control device transmits a first control signal. The second control device is respectively and electrically connected to the first control device and the test apparatus so as to receive the first control signal and to activate the test apparatus to test the first object according to the first control signal.

According to one embodiment of the present invention, after the first object is tested, the second control device will transmit a first testing result to the first control device, such that the first control device activates the first driving device and the first driving device drives the first transmission member, so as to lift the first cover according to the drive of the first transmission member.

According to one embodiment of the present invention, the first assisting device further comprises a first indicator light and a second indicator light. Both of the indicator lights are electrically connected to the first control device. If the testing result is satisfactory, the first indicator light illuminates, and if the testing result is unsatisfactory, the second indicator light illuminates.

According to one embodiment of the present invention, the test apparatus further comprises a second cover, and the base further comprises a second testing zone and a second assisting device. The second cover comprises a second pivoting end and a second connection end opposite to the second pivoting end, wherein the second cover and the base are pivotally connected to the second pivoting end. The second testing zone is used for placing and testing a second object. The second assisting device comprises a second driving device and a second transmission member. The second assisting device is electrically connected to the first control device. The second transmission member is respectively connected to the second driving device and the second connection end. When the activating device is triggered, the first control device activates the second driving device and the second driving device drives the second transmission member, so as to lower the second cover according to the drive of the second transmission member until the second cover covers the second testing zone.

According to one embodiment of the present invention, when the second cover covers the second testing zone, if the first control device has received the first testing result, the first control device transmits a second control signal to the second control device, such that the second control device will activate the test apparatus to test the second object. If the first control device has not yet received the first testing result, the first control device waits until it receives the first testing result, and then the first control device transmits the second control signal.

According to one embodiment of the present invention, after the second object is tested, the second control device transmits a second testing result to the first control device, such that the first control device activates the second driving device and the second driving device drives the second transmission member, so as to raise the second cover according to the drive of the second transmission member.

According to one embodiment of the present invention, the first driving device is a stepper motor, and the first transmission member is a timing belt.

According to one embodiment of the present invention, the first assisting device further comprises a position sensor used for detecting whether the first cover has been raised to a predetermined angle.

The present invention further discloses a testing method. The testing method comprises the following steps: placing a first object in a first testing zone; triggering an activating device; a first control device activating a first assisting device; the first assisting device lowering a first cover such that the first cover covers the first testing zone; the first control device transmitting a first control signal to a second control device;

the second control device activating a test apparatus to test the first object; the second control device transmitting a first testing result to the first control device; the first control device activating the first assisting device; the first assisting device raising the first cover; and removing the first object.

According to one embodiment of the present invention, after the second control device transmits the first testing result to the first control device, the testing method of the present invention further comprises the following steps: when the testing result is satisfactory; the first control device controlling a first indicator light to illuminate; and when the testing result is unsatisfactory, the first control device controlling a second indicator light to illuminate.

According to one embodiment of the present invention, the testing method of the present invention further comprises the following steps: placing a second object in a second testing zone; triggering the activating device; the first control device activating a second assisting device; the second assisting device lowering a second cover such that the second cover covers the second testing zone; determining whether the first control device has received the first testing result; if yes, the first control device transmitting a second control signal to the second control device; if no, the first control device waiting until it receives the first testing result and then transmitting the second control signal to the second control device; after receiving the second control signal, the second control device activating the test apparatus to test the second object; the second control device transmitting a second testing result to the first control device; the first control device activating the second assisting device; the second assisting device raising the second cover; and removing the second object.

Other objects, advantages, and novel features of the invention will become more apparent from the following detailed description when taken in conjunction with the accompanying drawings.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

Figure 1:
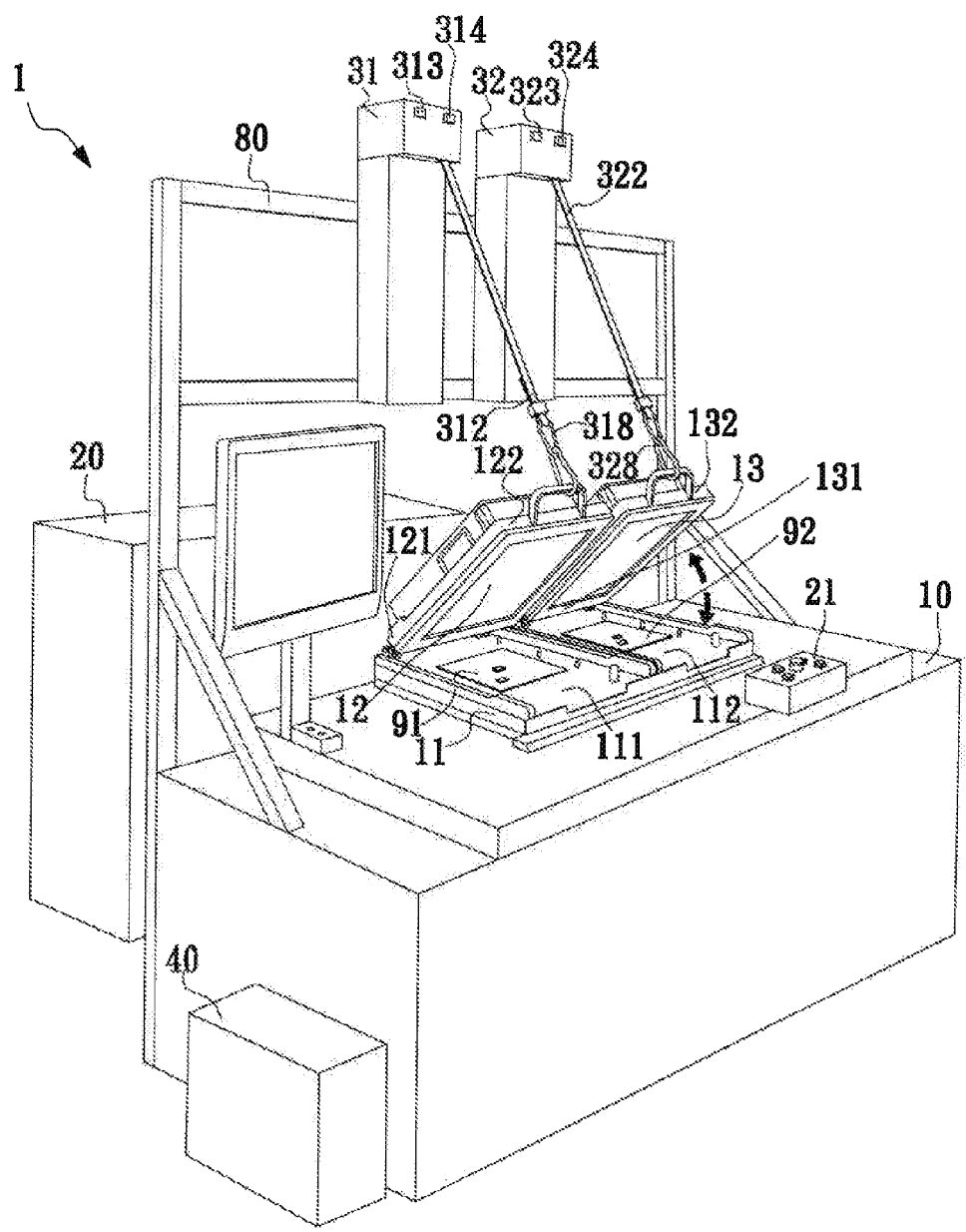
FIG. 1 illustrates a perspective schematic view of an automatic test equipment according to the present invention.
Figure 2:
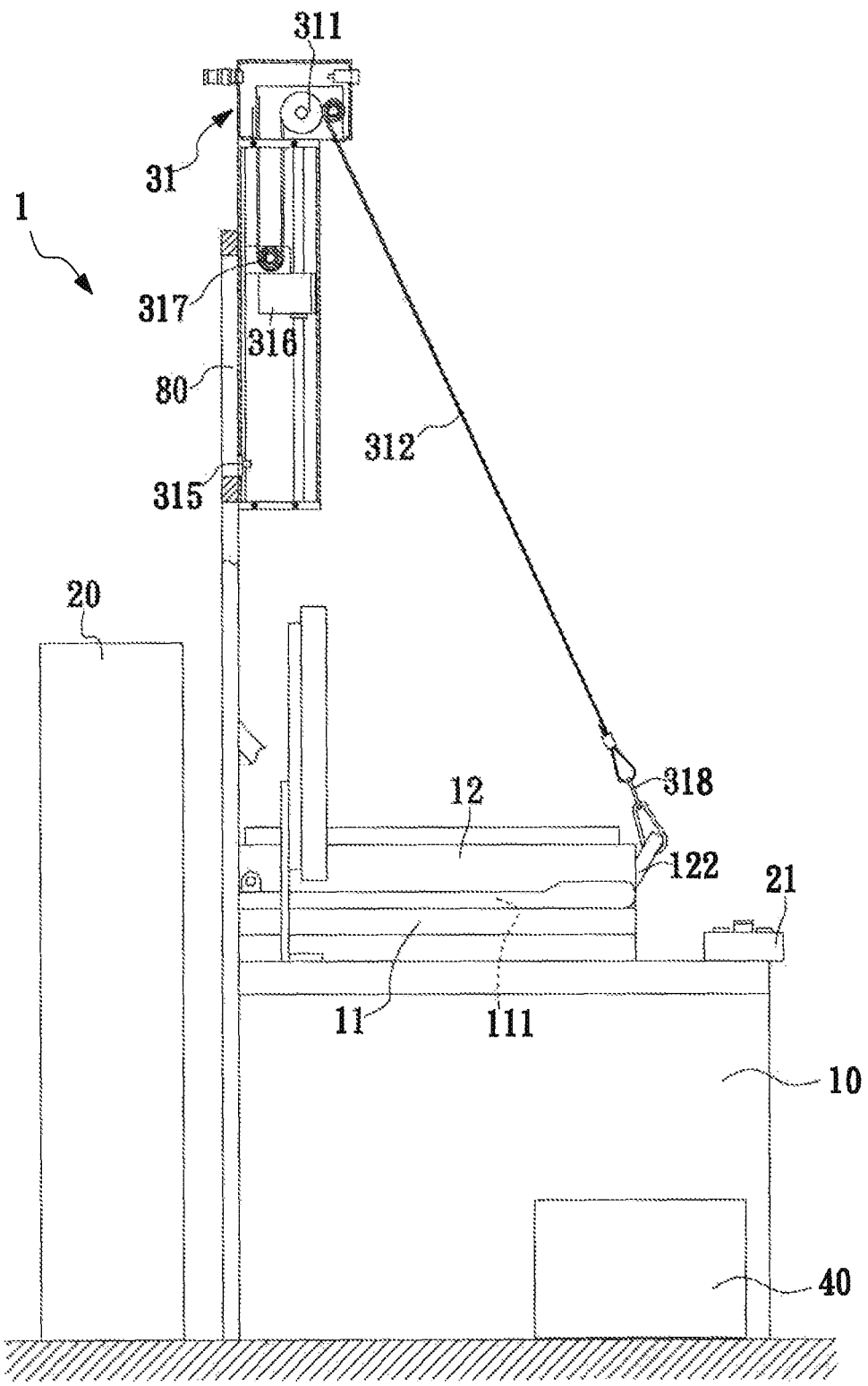
FIG. 2 illustrates a side view showing a first assisting device raising a first cover according to the present invention.
Figure 3:
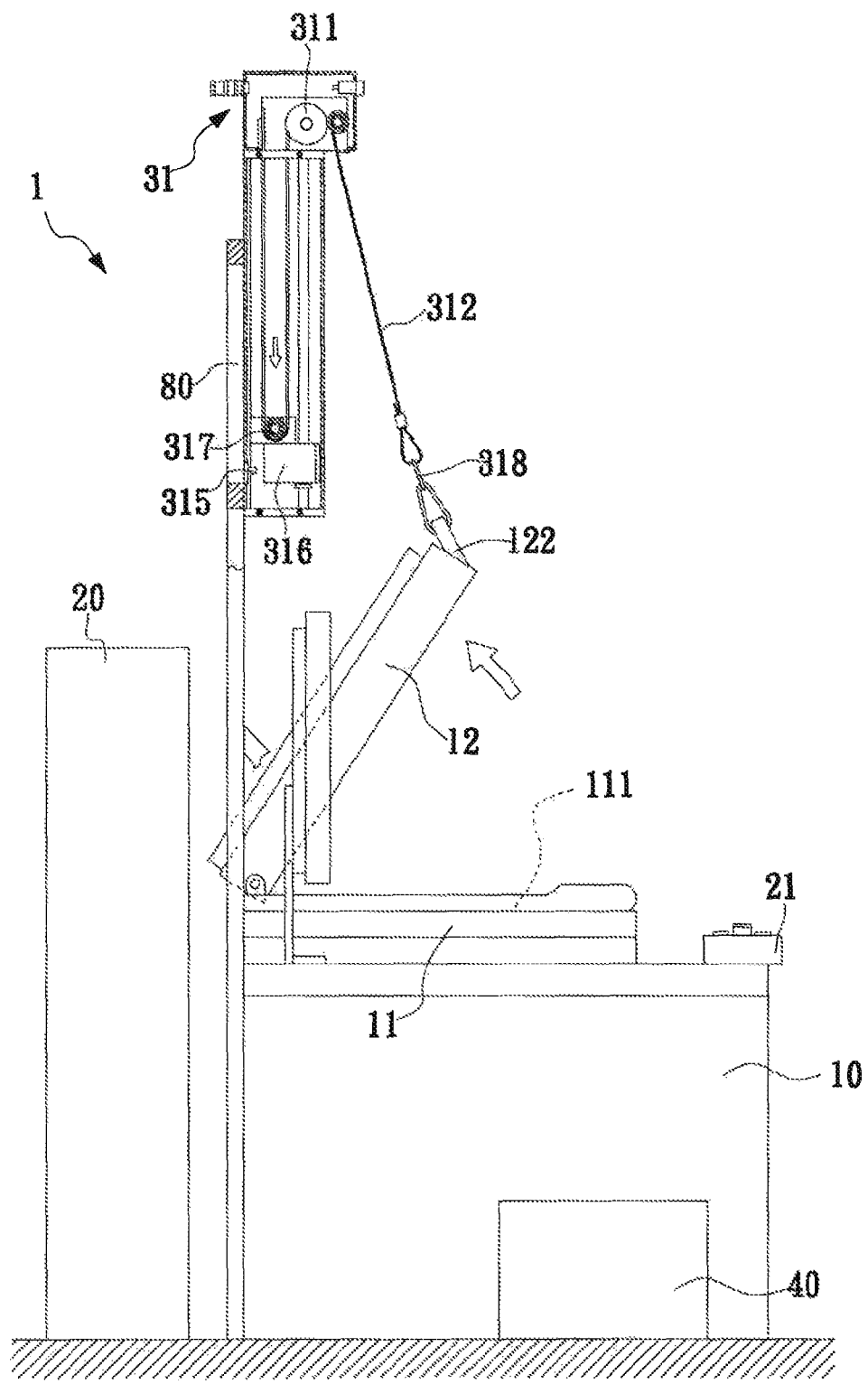
FIG. 3 illustrates a side view showing the first assisting device lowering the first cover according to the present invention.
Figure 4:
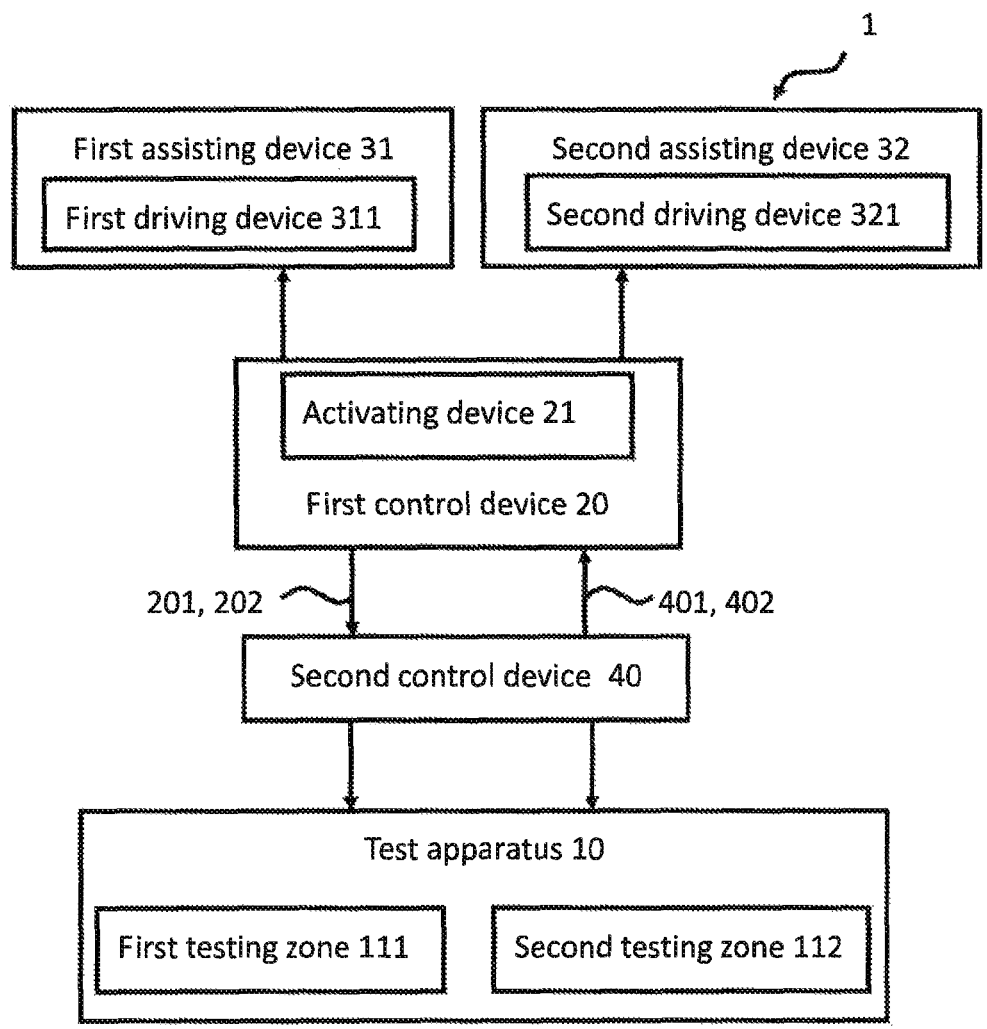
FIG. 4 illustrates a hardware configuration of the automatic test equipment according to the present invention.

Please refer to FIG. 1 to FIG. 4 for better understanding of an automatic test equipment according to a first embodiment of the present invention, wherein FIG. 1 illustrates a perspective schematic view of the automatic test equipment according to the present invention; FIG. 2 illustrates a side view showing a first assisting device raising a first cover; FIG. 3 illustrates a side view showing the first assisting device lowering the first cover; and FIG. 4 illustrates a hardware configuration of the automatic test equipment according to the present invention.

As shown in FIG. 1, in this embodiment, the automatic test equipment 1 of the present invention comprises a test apparatus 10, a first control device 20, a first assisting device 31, a second assisting device 32, a second control device 40 and a supporting rack 80. The first control device 20 controls the first assisting device 31. The second control device 40 controls the test apparatus 10, and can be electrically connected to and communicate with the first control device 20 via a communication interface. The supporting rack 80 stands in one side of the test apparatus 10 for setting the first assisting device 31 and the second assisting device 32.

In this embodiment, as shown in FIG. 1, the test apparatus 10 comprises a base 11, a first cover 12 and a second cover 13. The base 11 comprises a first testing zone 111 and a second testing zone 112, wherein the first testing zone 111 and the second testing zone 112 can be respectively used for placing a first object 91 and a second object 92, so as to allow the test apparatus 10 to test the first object 91 and the second object 92.

In this embodiment, the first testing zone 111 and the second testing zone 112 of the test apparatus 10 respectively have a testing needle bed (not shown in figures) used for alternately testing the first object 91 and the second object 92 placed in the first testing zone 111 and the second testing zone 112. The first object 91 and the second object 92 of the present invention are both printed circuit boards of electronic products, and are respectively placed in the first testing zone 111 and the second testing zone 112 for the testing needle bed to alternately test the first object 91 and the second object 92.

As shown in FIG. 1, the first cover 12 comprises a first pivoting end 121 and a first connection end 122 opposite to the first pivoting end 121. The first cover 12 and the base 11 are pivotally connected to the first pivoting end 121, such that the first cover 12 can rotate with respect to the first pivoting end 121 as an axis, and then according to the drive of the first assisting device 31, the first cover 12 can open or close (as shown in FIG. 2 and FIG. 3) with respect to the base 11. Further ore, when the first cover 12 is closed with respect to the base 11, the first cover 12 covers the first testing zone 111.

As shown in FIG. 1, the second cover 13 comprises a second pivoting end 131 and a second connection end 132 opposite to the second pivoting end 131. The second cover 13 and the base 11 are pivotally connected to the second pivoting end 131, such that the second cover 13 can rotate with respect to the second pivoting end 131, and then according to the drive of the second assisting device 32, the second cover 13 can open or close (similar to the first cover, as shown in FIG. 2 and FIG. 3) with respect to the base 11. Furthermore, when the second cover 13 is closed with respect to the base 11, the second cover 13 covers the second testing zone 112.

As shown in FIG. 1 and FIG. 4, the first control device 20 can be software, hardware, firmware or a combination thereof. In this embodiment, the first control device 20 is a programmable controller, which is installed in a control chassis. The first control device 20 is respectively and electrically connected to the first assisting device 31 and the second assisting device 32 for electrical communications, thereby controlling the first assisting device 31 and the second assisting device 32. Moreover, the first control device 20 further comprises an activating device 21. The activating device 21 of the present invention can at least comprise a start button and a stop button for an operator to selectively press so as to activate or stop the operation of the activating device 21. As shown in FIG. 1 and FIG. 4, the second control device 40 can be software, hardware, firmware or a combination thereof. In this embodiment, the second control device 40 is a computer used for controlling each kind of operation of the test apparatus 10.

As shown in FIG. 1 and FIG. 2, the first assisting device 31 of this embodiment comprises a first driving device 311, a first transmission member 312, a first indicator light 313, a second indicator light 314, a position sensor 315, a counterweight block 316, a pulley 317 and a buckle 318. The first transmission member 312 is respectively connected to the first driving device 311 and the pulley 317, thereby increasing a moving distance of the first transmission member 312 by means of installing the pulley 317. In this embodiment, the first driving device 311 is a stepper motor, the first transmission member 312 is a timing belt, and the first transmission member 312 is connected to the first connection end 122 through the buckle 318.

The first indicator light 313 and the second indicator light 314 are electrically connected to the first control device 20, respectively. Furthermore, the counterweight block 316 of this embodiment is located below the pulley 317, and the counterweight block 316 moves along with the pulley 317. The position sensor 315 is a photoelectric sensor, which can confirm whether the first cover 12 is being raised to a predetermined angle by means of detecting the position of the counterweight block 316. Please note that the predetermined angle does not have to be a specific and precise angle; it will work as long as the first cover 12 is being raised to provide an appropriate working space for the operator to remove the first object 91. In this embodiment, the predetermined angle for raising the first cover 12 is set as 60 degrees, but that angle is not intended to limit the scope of the present invention.

As shown in FIG. 2 and FIG. 4, when the activating device 21 is triggered, the first control device 20 activates the first driving device 311; the first driving device 311 drives the first transmission member 312, so as to gradually lower the first cover 12 according to the drive of the first transmission member 312 until the first cover 12 covers the first testing zone 111. Please note that the first control device 20 of this embodiment is a stepper motor, and the first control device 20 of the present invention determines whether the first cover 12 has covered the first testing zone 111 by means of calculating whether a pulse number of the first driving device 311 has reached a predetermined value. The pulse number of a predetermined value may vary according to covers associated with different types of test apparatuses. Therefore, regarding the setting of the predetermined value, technicians are needed to respectively perform tests on each test apparatus in advance, so as to determine the pulse number corresponding to the first driving device 311 when the first cover 12 covers the first testing zone 111, and then to use this pulse number as the predetermined value.

As shown in FIG. 2 and FIG. 4, after the first cover 12 covers the first testing zone 111, the first control device 20 transmits a first control signal 201 to the second control device 40, such that the second control device 40 will activate the test apparatus 10 according to the first control signal 201, so as to allow the first testing needle bed in the test apparatus 10 to test the first object 91.

As shown in FIG. 3, after the first object 91 is tested, the second control device 40 transmits a first testing result 401 to the first control device 20, and meanwhile the first control device 20 once again activates the first driving device 311, so as to cause the first driving device 311 to drive the first transmission member 312, thereby gradually raising the first cover 12 according to the drive of the first transmission member 312 to facilitate the operator to remove the first object 91. In this embodiment, the drive of the first transmission member 312 gradually raises the first cover 12 until the inclined angle between the first cover 12 and the base 11 reaches 60 degrees, such that the operator can easily remove the first object 91.

In this embodiment, when the inclined angle between the first cover 12 and the base 11 reaches 60 degrees, as shown in FIG. 3, the counterweight block 316 has slid to the front of the position sensor 315 and therefore covers the light from the position sensor 315, such that the position sensor 315 will accordingly confirm that the first cover 12 has reached a fixed position.

Please note that in addition to using the position sensor 315 to detect the position of the counterweight block 316 for confirming whether the first cover 12 has been raised to an angle of 60 degrees, the first control device 20 can also doubly confirm whether the first cover 12 has been raised to an angle of 60 degrees by means of calculating whether the pulse number of the first driving device 311 has reached a predetermined value. However, as disclosed above, the pulse number of the predetermined value may vary according to covers associated with different types of test apparatuses. Therefore, regarding the setting of the predetermined value, technicians are needed to respectively perform tests on each test apparatus in advance, so as to determine the pulse number to use as the predetermined value corresponding to the first driving device 311 when the first cover 12 has been raised to an angle of 60 degrees.

After the first object 91 is tested, the first control device 20 controls the first indicator light 313 and the second indicator light 314 to illuminate according to the first testing result 401, wherein if the testing result 401 is satisfactory, the first control device 20 controls the first indicator light 313 to illuminate (in green light); otherwise, if the testing result 401 is unsatisfactory, the first control device 20 controls the second indicator light 314 to illuminate (in red light), so as to let the operator understand whether the first object 91 has passed the test. However, persons skilled in the related arts will also appreciate that a single dual-color or multi-color indicator light used to indicate whether the first object 91 is satisfactory or unsatisfactory by different illumination colors is an equivalent design as disclosed by the scope of the present invention; or, that the "indicator light" disclosed in this invention generally refers to a colored light signal rather than a physical structure element.

Please return to FIG. 1; the internal structures and element operations of the second assisting device 32 of the automatic test equipment 1 are the same as those of the first assisting device 31. That is, the second assisting device 32 also comprises a second driving device 321, a second transmission member 322, a first indicator light 323, a second indicator light 324, a buckle 328, and other elements such as a counterweight block, a position sensor, and a pulley, which are not shown in the figures. Therefore, there is no need for further description of the internal elements, detailed structures, and functions of the second assisting device 32. What is different from the first assisting device 31 is that the second transmission member 322 of the second assisting device 32 is connected to the second connection end 132 of the second cover 13 through the buckle 328.

After the second object 92 is placed in the second testing zone 112, the operator can trigger the activating device 21 by means of pressing the activating device 21. At this time, the first control device 20 activates the second driving device 321, and the second driving device 321 drives the second transmission member 322, so as to lower the second cover 13 according to the drive of the second transmission member 322 until the second cover 13 covers the second testing zone 112. After the second cover 13 covers the second testing zone 112, if the first control device 20 has received the first testing result 401, it means the first object 91 has finished the test, such that the second testing needle bed in the test apparatus 10 can test the second object 92. As a result, the first control device 20 will transmit a second control signal 202 to the second control device 40, such that the second control device 40 will activate the test apparatus 10 to cause the second testing needle bed in the test apparatus 10 to test the second object 92.

After the second object 92 is tested, the second control device 40 transmits a second testing result 402 to the first control device 20, and meanwhile the first control device 20 once again activates the second driving device 321, so as to cause the second driving device 321 to drive the second transmission member 322, thereby gradually raising the second cover 13 according to the drive of the second transmission member 322 until the inclined angle between the second cover 13 and the base 11 reaches 60 degrees, so as to facilitate the operator to remove the second object 92.

After the second object 92 is tested, the first control device 20 controls the first indicator light 323 and the second indicator light 324 to illuminate according to the second testing result 402, wherein if the testing result 402 is satisfactory, the first indicator light 323 illuminates (in green light); otherwise, if the testing result 402 is unsatisfactory, the second indicator light 324 illuminates (in red light), so as to let the operator understand whether the second object 92 has passed the test.

Please note that after the second cover 13 covers the second testing zone 112, if the first control device 20 has not yet received the first testing result 401, it means the first object 91 has not finished the test, and therefore the second testing needle bed in the test apparatus 10 cannot test the second object 92. Therefore, the second control signal 202 will not be transmitted until the first control device 20 receives the first testing result 401. Moreover, the activating device 21 can be a single device having both a start button and a stop button, or two independent devices respectively installed with a start button and a stop button for the operator to selectively press to correspondingly start/stop the operation of the first assisting device 31 or the second assisting device 32.

Figure 5:
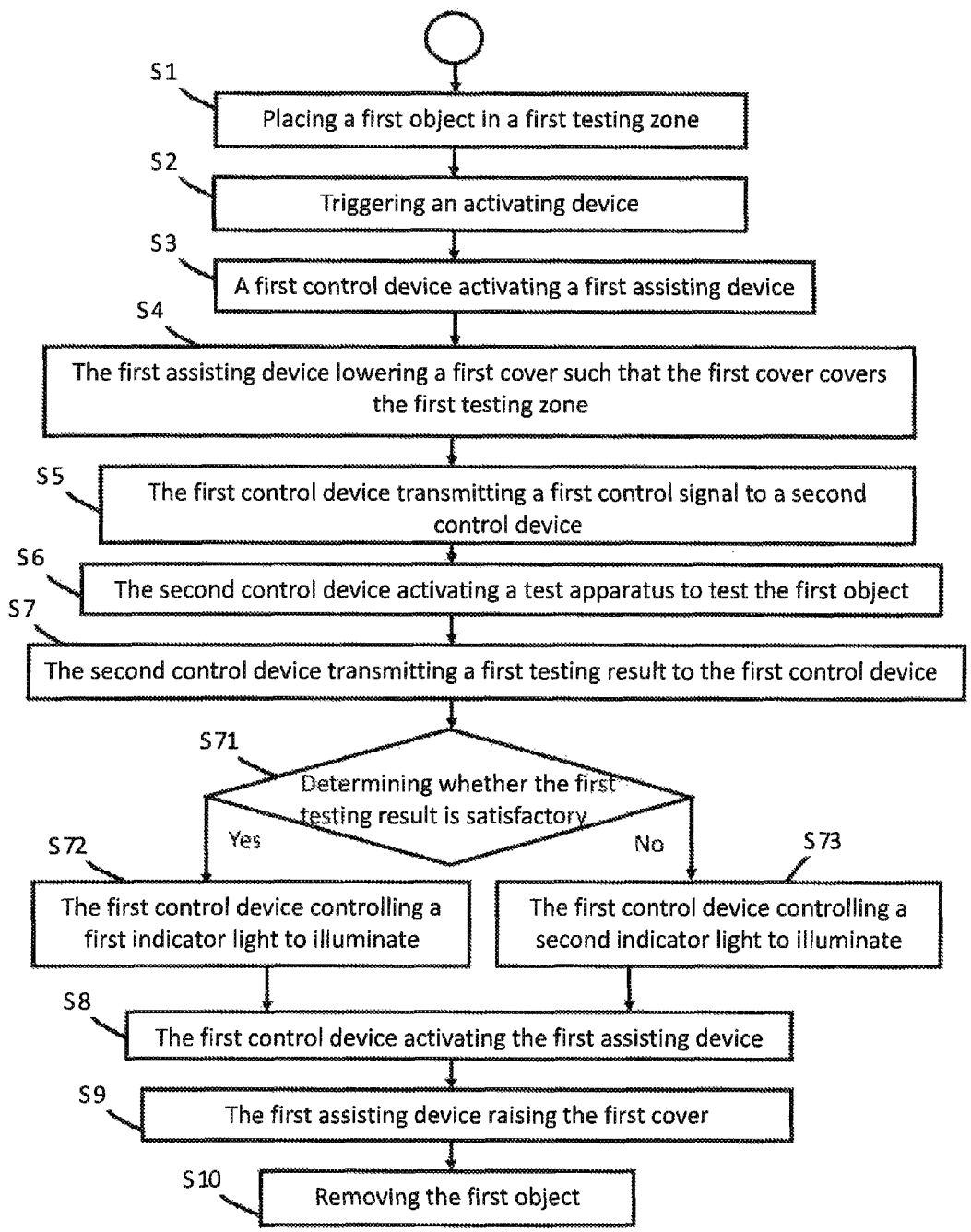
FIG. 5 illustrates a flowchart of a testing method according to one embodiment of the present invention.
Figure 6:
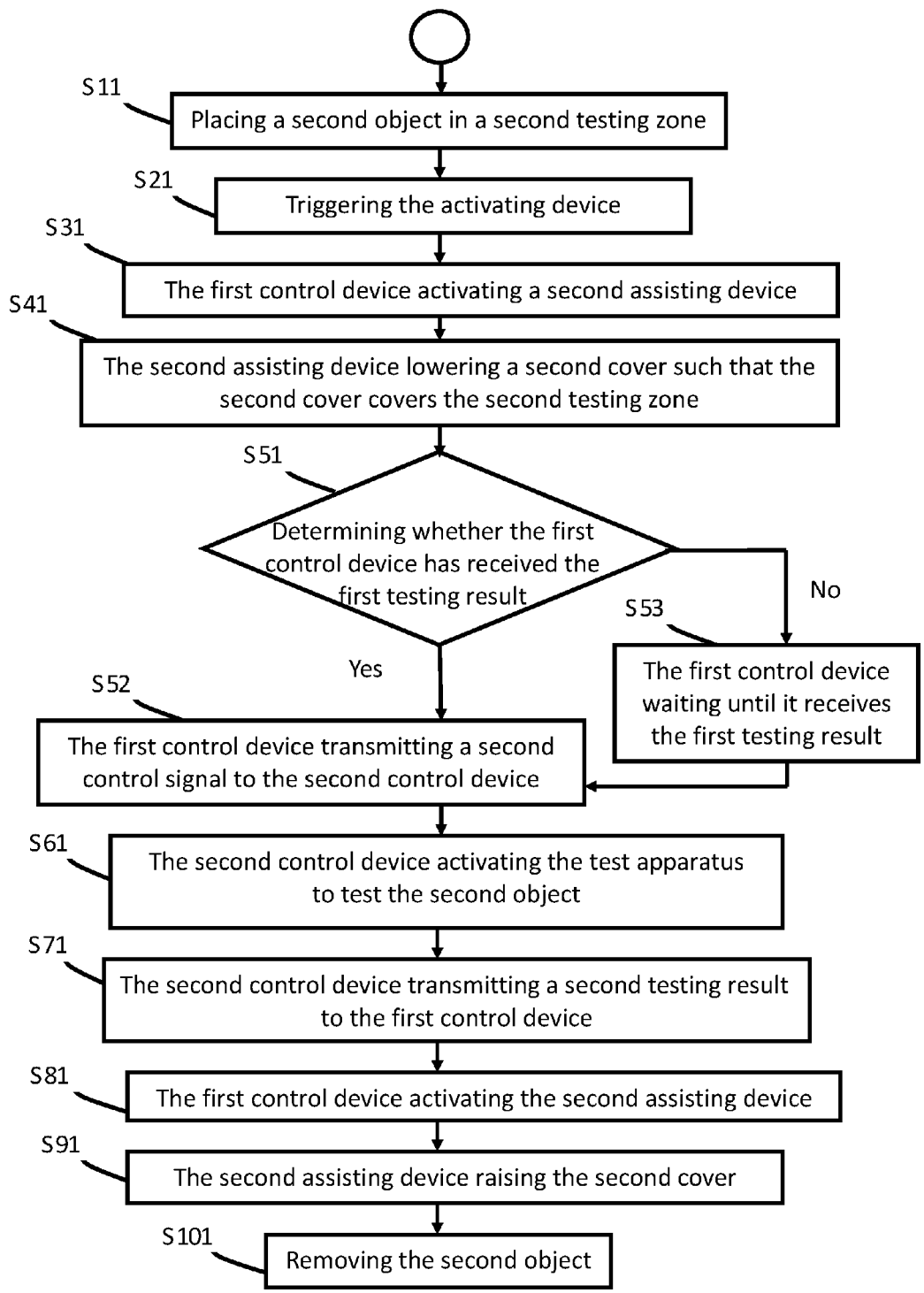
FIG. 6 illustrates a flowchart of the testing method according to another embodiment of the present invention.

Please continue to refer to FIGS. 1 to 4, and also refer to FIG. 5 and FIG. 6 for better understanding of the steps of a testing method of the present invention, wherein FIG. 5 illustrates a flowchart of the testing method according to one embodiment of the present invention; and FIG. 6 illustrates a flowchart of the testing method according to another embodiment of the present invention.

The testing method of the present invention is applied in the automatic test equipment 1. The automatic test equipment 1 comprises the test apparatus 10, the first control device 20, the first assisting device 31 and the second control device 40. The test apparatus 10 comprises the first testing zone 111 and the first cover 12. The first control device 20 comprises the activating device 21. As shown in FIG. 5, the testing method of the present invention comprises the following steps:

Step S1: placing the first object in the first testing zone.

The operator places the first object 91 in the first testing zone 111 of the test apparatus 10.

Step S2: triggering the activating device.

The operator presses the activating device 21 so as to trigger the activating device 21.

Step S3: the first control device activating the first assisting device.

The first assisting device 31 comprises the first driving device 311 and the first transmission member 312. When the activating device 21 is triggered, the first control device 20 activates the first driving device 311 of the first assisting device 31.

Step S4: the first assisting device lowering the first cover such that the first cover covers the first testing zone.

When the first driving device 311 is activated, the first driving device 311 drives the first transmission member 312 to gradually lower the first cover 12 according to the drive of the first transmission member 312 until the first cover 12 covers the first testing zone 111. In this embodiment, the first driving device 311 is a stepper motor, and the first control device 20 determines whether the first cover 12 has covered the first testing zone 111 by means of calculating whether the pulse number of the first driving device 311 has reached a predetermined value.

Step S5: the first control device transmitting the first control signal to the second control device.

When the first control device 20 calculates that the pulse number of the first driving device 311 has reached a predetermined value, the first control device 20 confirms that the first cover 12 has covered the first testing zone 111. At this time, the first control device 20 transmits the first control signal 201 to the second control device 40.

Step S6: the second control device activating the test apparatus to test the first object.

The second control device 40 receives the first control signal 201 and activates the test apparatus 10 according to the first control signal 201, so as to cause the first testing needle bed in the test apparatus 10 to test the first object 91.

Step S7: the second control device transmitting the first testing result to the first control device.

After the first object 91 is tested, the second control device 40 transmits the first testing result 401 to the first control device 20.

Step S71: determining whether the first testing result is satisfactory.

If the determination is yes, the method performs step S72.

Otherwise, if the determination is no, the method performs step S73.

Step S72: the first control device controlling the first indicator light to illuminate.

If the testing result 401 is satisfactory the first control device 20 will control the first indicator light 313 to illuminate (in green light), so as to let the operator know that the first object 91 is satisfactory Step S73: the first control device controlling the second indicator light to illuminate.

If the testing result 401 is unsatisfactory the first control device 20 will control the second indicator light 314 to illuminate (in red light), so as to let the operator know that the first object 91 is unsatisfactory.

Step S8: the first control device activating the first assisting device.

After the first control device 20 receives the first testing result 401, the first control device 20 once again activates the first driving device 311 of the first assisting device 31.

Step S9: the first assisting device raising the first cover.

After the first driving device 311 is activated, the first driving device 311 will drive the first transmission member 312, thereby gradually raising the first cover 12 according to the drive of the first transmission member 312. The method further confirms whether the first cover 12 is being raised to a fixed position by means of utilizing the position sensor 315 to detect the position of the counterweight block 316, or by means of calculating the pulse number of the first driving device 311. In this embodiment, when the inclined angle between the first cover 12 and the base 11 reaches 60 degrees, it means the first cover 12 has been raised to the fixed position.

Step S10: removing the first object.

After the first cover 12 has been raised, the operator can then remove the first object 91, so as to complete testing of the first object 91.

Please refer to FIG. 1, FIG. 4 and FIG. 6. The automatic test apparatus 1 of the present invention further comprises a second assisting device 32, wherein the test apparatus 10 further comprises a second testing zone 112 and a second cover 13. As shown in FIG. 6, the testing method of the present invention comprises the following steps:

Step S11: placing the second object in the second testing zone.

The operator places the second object 92 in the second testing zone 112 of the test apparatus 10.

Step S21: triggering the activating device.

The operator presses the activating device 21 so as to trigger the activating device 21.

Step S31: the first control device activating the second assisting device.

The second assisting device 32 comprises the second driving device 321 and the second transmission member 322. When the activating device 21 is triggered, the first control device 20 activates the second driving device 321 of the second assisting device 32.

Step S41: the second assisting device lowering the second cover such that the second cover covers the second testing zone.

When the second driving device 321 is activated, the second driving device 321 drives the second transmission member 322 to gradually lower the second cover 13 according to the drive of the second transmission member 322 until the second cover 13 covers the second testing zone 112. In this embodiment, the second driving device 321 is a stepper motor, and the first control device 20 of the present invention determines whether the second cover 13 has covered the second testing zone 112 by means of calculating whether the pulse number of the second driving device 321 has reached a predetermined value.

Step S51: determining whether the first control device has received the first testing result.

If the determination is yes, the method performs step S52. Otherwise, if the determination is no, the method performs step S53.

Step S52: the first control device transmitting the second control signal to the second control device.

After the second cover 13 covers the second testing zone 112, if the first control device 20 has received the first testing result 401, it means the first object 91 has finished the test, such that the second testing needle bed in the test apparatus 10 can test the second object 92. Meanwhile, the first control device 20 will transmit the second control signal 202 to the second control device 40, so as to cause the second testing needle bed in the test apparatus 10 to test the second object 92.

Step S53: the first control device waiting until it receives the first testing result.

After the second cover 13 covers the second testing zone 112, if the first control device 20 has not received the first testing result 401, it means the first object 91 has not finished the test, and therefore the second testing needle bed in the test apparatus 10 cannot start to test the second object 92. At this time, the first control device 20 has to wait until it receives the first testing result 401, so as to activate the test apparatus 10 to test the second object 92.

Step S61: the second control device activating the test apparatus to test the second object.

The second control device 40 receives the second control signal 202 and activates the test apparatus 10 according to the second control signal 202, so as to cause the second testing needle bed in the test apparatus 10 to test the second object 92.

Step S71: the second control device transmitting the second testing result to the first control device.

After the second object 92 is tested, the second control device 40 transmits the second testing result 402 to the first control device 20.

Step S81: the first control device activating the second assisting device.

After the first control device 20 receives the second testing result 402, the first control device 20 once again activates the second driving device 321 of the second assisting device 32. Please note that the first control device 20 can also control the first indicator light 323 or the second indicator light 324 to illuminate, so as to let the operator know whether the testing result of the second object 92 is satisfactory. Because this part of the operation is the same as how the first assisting device 31 operates, there is no need for further description; please refer to steps S71 to S73 for related explanations.

Step S91: the second assisting device raising the second cover.

After the second driving device 321 is activated, the second driving device 321 will drive the second transmission member 322, thereby gradually raising the second cover 13 according to the drive of the second transmission member 322. The method further confirms whether the second cover 13 is being raised to a fixed position by means of utilizing a position sensor installed in the second assisting device 32 to detect the position of a counterweight block, or by calculating the pulse number of the second driving device 321. In this embodiment, when the inclined angle between the second cover 13 and the base 11 reaches 60 degrees, it means the second cover 13 has been raised to the fixed position.

Step S101: removing the second object.

After the second cover 13 has been raised, the operator can then remove the second object 92, so as to finish the test of the second object 92.

Please note that the testing method of the present invention is not limited to the above steps and sequences; the above step sequences can be adjusted accordingly as long as the object of the present invention can be achieved.

According to the automatic test equipment 1 and the testing method of the present invention, the procedure of requesting the operator to manually raise and lower the first cover 12 or the second cover 13 can be omitted. On one hand, it protects the operator's body from being harmed, and on the other, it reduces the chance of operational error caused due to the operator's work fatigue, thereby enhancing the overall efficiency and accuracy of the test process.

Although the present invention has been explained in relation to its preferred embodiments, it is to be understood that many other possible modifications and variations can be made without departing from the spirit and scope of the invention as hereinafter claimed.

What is claimed is:

1. An automatic test equipment, comprising: a test apparatus, applied for testing a first object and a second object, the test apparatus comprising: a base, comprising a first testing zone and a second testing zone, the first object being placed and tested in the first testing zone and the second object being placed and tested in the second testing zone; and a first cover, comprising a first pivoting end and a first connection end opposite to the first pivoting end, wherein the first cover and the base are pivotally connected to the first pivoting end; a first control device, comprising an activating device; a first assisting device, electrically connected to the first control device, the first assisting device comprising: a first driving device, activated by the first control device; and a first transmission member, connected to the first driving device and the first connection end, wherein the first driving device drives the first transmission member to lower the first cover according to the drive of the first transmission member until the first cover covers the first testing zone, and then the first control device transmits a first control signal; and a second control device, electrically connected to the first control device and the test apparatus, used for receiving the first control signal and allowing the test apparatus to test the first object according to the first control signal to generate a first testing result, wherein the second control device allows the test apparatus to test the second object only when the first testing result has been received by the first control device and then a second control signal is transmitted to the second control device by the first control device.

2. The automatic test equipment as claimed in claim 1, wherein the first assisting device further comprises a first indicator light, which is electrically connected to the first control device, wherein, when the testing result is satisfactory, the first indicator light illuminates.

3. The automatic test equipment as claimed in claim 2, wherein the first assisting device further comprises a second indicator light, which is electrically connected to the first control device, wherein, when the testing result is unsatisfactory, the second indicator light illuminates.

4. The automatic test equipment as claimed in claim 1, wherein the test apparatus further comprises a second cover, which comprises a second pivoting end and a second connection end opposite to the second pivoting end, wherein the second cover and the base are pivotally connected to the second pivoting end.

5. The automatic test equipment as claimed in claim 4, wherein the automatic test equipment further comprises a second assisting device electrically connected to the first control device, and the second assisting device comprises a second driving device, wherein, when the activating device is triggered, the first control device activates the second driving device.

6. The automatic test equipment as claimed in claim 5, the second assisting device comprises a second transmission member, which is respectively connected to the second driving device and the second connection end, wherein, when the second driving device is activated, the second driving device drives the second transmission member, so as to lower the second cover according to the drive of the second transmission member until the second cover covers the second testing zone.

7. The automatic test equipment as claimed in claim 1, wherein the first driving device is a stepper motor, and the first transmission member is a timing belt.

8. The automatic test equipment as claimed in claim 1, wherein the first assisting device further comprises a position sensor used for detecting whether the first cover is being raised to a predetermined angle.

9. A testing method, applied in an automatic test equipment, the automatic test equipment comprising a test apparatus, a first control device, a first assisting device and a second control device, wherein the test apparatus comprises a first testing zone, a second testing zone and a first cover, and the first control device comprises an activating device, the testing method comprising the following steps:
   placing a first object in the first testing zone;
   triggering the activating device;
   the first control device activating the first assisting device;
   the first assisting device lowering the first cover such that the first cover covers the first testing zone;
   the first control device transmitting a first control signal to the second control device;
   the second control device activating the test apparatus to test the first object to generate a first testing result;
   the second control device transmitting the first testing result to the first control device;
   the first control device activating the first assisting device;
   the first assisting device raising the first cover;
   removing the first object;
   placing a second object in the second testing zone;
   determining whether the first control device receives the first testing result;
   when the first control device has received the first testing result, transmitting a second control signal to the second control device by the first control device; and
   testing the second object by the test apparatus.

10. The testing method as claimed in claim 9, wherein the first assisting device further comprises a first indicator light and a second indicator light, and after the second control device transmits the first testing result to the first control device, the testing method further comprises the following steps:
   when the testing result is satisfactory, the first control device controlling the first indicator light to illuminate; and
   when the testing result is unsatisfactory, the first control device controlling the second indicator light to illuminate.

11. The testing method as claimed in claim 9, wherein the test apparatus further comprises a second cover, the automatic test equipment further comprises a second assisting device, and the testing method further comprises the following steps:
   triggering the activating device;
   the first control device activating the second assisting device;
   the second assisting device lowering the second cover such that the second cover covers the second testing zone;
   when first control device has yet received the first testing result, the first control device waiting until it receives the first testing result and then transmitting the second control signal to the second control device;
   the second control device transmitting a second testing result to the first control device;
   the first control device activating the second assisting device;
   the second assisting device raising the second cover; and
   removing the second object.

* * * * *